US011410965B2

(12) United States Patent
Tuominen

(10) Patent No.: US 11,410,965 B2
(45) Date of Patent: Aug. 9, 2022

(54) ELECTRONIC DEVICE WITH EMBEDDED COMPONENT CARRIER

(71) Applicant: AT & S Austria Technologie & Systemtechnik Aktiengesellschaft, Leoben (AT)

(72) Inventor: Mikael Tuominen, Shanghai (CN)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 15/869,674

(22) Filed: Jan. 12, 2018

(65) Prior Publication Data

US 2018/0199438 A1    Jul. 12, 2018

(30) Foreign Application Priority Data

Jan. 12, 2017   (CN) .......................... 201710022936.8

(51) Int. Cl.
| | |
|---|---|
| *H01L 23/00* | (2006.01) |
| *H05K 1/11* | (2006.01) |
| *H01L 23/498* | (2006.01) |
| *H01L 23/538* | (2006.01) |
| *H05K 1/18* | (2006.01) |

(Continued)

(52) U.S. Cl.
CPC ........ *H01L 24/82* (2013.01); *H01L 23/49822* (2013.01); *H01L 23/49827* (2013.01); *H01L 23/5389* (2013.01); *H01L 24/10* (2013.01); *H01L 24/23* (2013.01); *H01L 24/81* (2013.01); *H05K 1/115* (2013.01); *H05K 1/185* (2013.01); *H05K 3/4691* (2013.01);

(Continued)

(58) Field of Classification Search
None
See application file for complete search history.

(56) References Cited

U.S. PATENT DOCUMENTS

| | | | | |
|---|---|---|---|---|
| 5,691,210 A | * | 11/1997 | Mori ..................... | G01R 1/0483 438/127 |
| 6,468,642 B1 | * | 10/2002 | Bray ..................... | B26B 21/60 428/216 |

(Continued)

FOREIGN PATENT DOCUMENTS

| | | |
|---|---|---|
| CN | 101631424 A | 1/2010 |
| CN | 102159021 A | 8/2011 |

(Continued)

OTHER PUBLICATIONS

Notification of First Office Action (English Translation) in Application 201710022936.8; The China National Intellectual Property Administration; dated Dec. 24, 2019; pp. 1-3.

(Continued)

*Primary Examiner* — Anthony Ho
*Assistant Examiner* — Kevin Quinto
(74) *Attorney, Agent, or Firm* — Robert A. Blaha; Smith Tempel Blaha LLC

(57) ABSTRACT

An electronic device having a first component carrier and an electronic component which is surface mounted on or embedded within the first component carrier. The electronic device further has a second component carrier. The first component carrier together with the electronic component is at least partially embedded within the second component carrier.

12 Claims, 2 Drawing Sheets

(51) Int. Cl.
  *H05K 3/46* (2006.01)
  *H05K 3/32* (2006.01)
(52) U.S. Cl.
  CPC .......... *H01L 23/5387* (2013.01); *H05K 3/323* (2013.01); *H05K 3/4611* (2013.01)

(56) References Cited

U.S. PATENT DOCUMENTS

| | | | |
|---|---|---|---|
| 7,777,328 B2 | 8/2010 | Enomoto | |
| 8,692,135 B2 | 4/2014 | Funaya et al. | |
| 2002/0140076 A1* | 10/2002 | Yamazaki | H01L 23/49822 257/686 |
| 2003/0001252 A1* | 1/2003 | Ku | H01L 23/3107 257/686 |
| 2004/0150107 A1* | 8/2004 | Cha | H01L 23/3114 257/738 |
| 2007/0134849 A1* | 6/2007 | Vanfleteren | H01L 23/5389 438/123 |
| 2008/0139046 A1* | 6/2008 | Semba | H01R 12/598 439/579 |
| 2010/0103634 A1 | 4/2010 | Funaya et al. | |
| 2012/0170231 A1* | 7/2012 | Lee | H05K 1/145 361/749 |
| 2014/0202743 A1* | 7/2014 | Kim | H05K 1/188 174/254 |
| 2015/0257273 A1* | 9/2015 | Nanjo | H01L 23/5383 361/761 |
| 2015/0373854 A1* | 12/2015 | Ikemoto | H04N 5/225 361/767 |
| 2017/0062992 A1 | 3/2017 | Fischeneder et al. | |

FOREIGN PATENT DOCUMENTS

| | | |
|---|---|---|
| CN | 102164452 A | 8/2011 |
| CN | 103313530 A | 9/2013 |
| CN | 204425778 U | 6/2015 |
| KR | 20120031362 A | 4/2012 |
| TW | 201112888 A | 4/2011 |

OTHER PUBLICATIONS

Office Action in China Patent Application No. 201710022936.8; pp. 1-13; dated Mar. 10, 2021; China National Intellectual Property Administration; No. 6, Xitucheng Lu, Jimenqiao Haidian District, Beijing City; 100088; China.

English translation of cover page of Office Action in China Patent Application No. 20170022936.8; pp. 1-3; China National Intellectual Property Administration; No. 6, Xitucheng Lu, Jimenqiao Haidian District, Beijing City; 100088; China.

* cited by examiner

ELECTRONIC DEVICE WITH EMBEDDED COMPONENT CARRIER

CROSS-REFERENCE TO RELATED APPLICATION

This application claims the benefit of the filing date of the Chinese Patent Application No. 2017100229368 filed 12 Jan. 2017, the disclosure of which is hereby incorporated herein by reference.

TECHNICAL FIELD

Embodiments of the invention relate to an electronic device and a method of manufacturing an electronic device.

BACKGROUND

Growing product functionalities of electronic devices are resulting in more densely packed component carriers, such as printed circuit boards (PCBs), as well as in a rising number of electronic components to be mounted on or embedded within the component carriers. In order to provide more accommodation space for electronic components, it is possible to provide a plurality of component carriers which can be e.g. vertically stacked and electrically connected to each other. Conventionally, rigid component carriers are used for such complex "3-dimensional" arrangements of stacked or sandwiched component carriers, since flexible component carriers in a vertically stacked arrangement are more prone to delamination, especially when they are bent.

U.S. Pat. No. 8,692,135 B2 discloses a plurality of wiring boards with embedded functional elements. The wiring boards each comprise a resin layer and a supporting plate which is made of a rigid material such as glass or ceramic. As shown in FIG. 13, the wiring boards are connected to each other by an adhesion layer 40 in a sandwich-like manner.

US 2010/0 103 634 A1 discloses an arrangement of two circuit boards which have functional devices embedded therein. The illustrated circuit boards are stacked on one another in a thickness direction and attached to each other by an adhesive layer.

U.S. Pat. No. 7,777,328 B2 discloses a multi-layer circuit board which comprises a plurality of substrates each having an embedded semiconductor device. The substrates are bonded to each other in a vertical direction in order to form the multi-layer circuit board.

KR 20 120 031 362 A discloses a plurality of circuit devices with embedded electronic components. The circuit devices are directly stacked on each other and electrically connected by bumps.

SUMMARY

There may be a need to provide an electronic device with an improved robustness.

In order to meet the need defined above, an electronic device and a method of manufacturing an electronic device according to the independent claims are provided.

According to an exemplary embodiment of the invention, an electronic device is provided which comprises a first component carrier and an electronic component which is surface mounted on the first component carrier or embedded within the first component carrier. The electronic device further comprises a second component carrier, wherein the first component carrier together with the electronic component is at least partially embedded within the second component carrier.

The first component carrier and the second component carrier may be printed circuit boards (PCBs) or any other type of substrates used for building up electronic assemblies. The electronic component may be surface mounted on an electrically conductive layer structure (e.g. a copper foil) of the first component carrier by soldering using a solder paste alloy, by wire bonding, or by adhesion using an electrically conductive adhesive, for example an anisotropic conductive film (ACF). Instead of surface mounting the electronic component on the first component carrier, the electronic component can be embedded within the first component carrier, wherein an electrical connection of the electronic component to the first component carrier can also be provided by soldering, wire bonding and/or adhesion using the electrically conductive adhesive. Embedding the electronic component within the first component carrier may provide an improved protection of the electronic component against mechanical stress.

The first component carrier can be at least partially embedded within the second component carrier such that the first component carrier is surrounded by the second component carrier e.g. from at least three sides. That is, not only the main surfaces of the first component carrier (which are referred to as "upper" and "lower" surfaces in the following) are surrounded by portions (e.g. layers) of the second component carrier, but also at least one lateral side of the first component carrier. It is also possible to embed the first component carrier within the second component carrier such that the second component carrier surrounds the first component carrier from the upper and lower side and in addition from two, three, or four lateral sides.

Overview of Embodiments

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above mentioned types of component carriers.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In an embodiment, the component carrier is a laminate-type component carrier. In such an embodiment, the component carrier is a compound of multiple layer structures which are stacked and connected together by applying a pressing force, if desired accompanied by heat.

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular materials coated with supra-conductive material such as graphene.

The term "lateral side" may denote a side of the component carrier which may be aligned perpendicular to the upper or lower side of the component carrier. The term "side" applies in particular in the case that the component carrier has a polygonal shape, e.g. a cuboid shape. Of course it is also possible to provide a component carrier with any other shape, e.g. having a circular base area. Therefore, the term "surrounded from all sides" may also denote "surrounded from all directions".

In particular, the first component carrier may be embedded within a cavity in the second component carrier such that the first component carrier is fully circumferentially embedded within the second component carrier. In other words, the second component carrier may surround the first component carrier from all lateral sides (or from all lateral directions).

The first component carrier may be electrically and/or mechanically connected to the second component carrier by soldering using a solder paste alloy, by wire bonding, or by adhesion using an electrically conductive adhesive, for example the anisotropic conductive film.

According to another exemplary embodiment of the invention, a method of manufacturing an electronic device is provided. The method comprises embedding an electronic component within a first component carrier or surface mounting the electronic component on the first component carrier. The method further comprises at least partially embedding the first component carrier with the electronic component within the second component carrier.

In particular, embedding the electronic component within the first component carrier may comprise providing an electrically insulating layer, e.g. a prepreg layer, forming a cavity in the electrically insulating layer, attaching the electronic component within the cavity, and attaching a further electrically insulating layer on the electronic component, such that the further electrically insulating layer closes the cavity. Said layers can be firmly attached to each other by laminating, i.e. by heat pressing the layers together.

When a first component carrier is used which comprises electrically conductive layers, embedding the electronic component may comprise attaching the electronic component to the electrically conductive layer structure (e.g. the copper foil) of the first component carrier, e.g. by electrically conductive adhesive, arranging an electrically insulating layer structure, for example a prepreg layer, above the electronic component, and subsequently laminating the electrically conductive layer structure, the electronic component and the electrically insulating layer structure together. The laminating step may be performed by applying heat and pressure. As electrically insulating layer structure, a pre-structured layer may be used, e.g. a prepreg sheet in which a cavity is formed for accommodating the electronic component.

In the context of the present application, the term "embedded" denotes that a structure is surrounded by a further structure from at least three sides. That is, an "embedded" structure differs from a "stacked", "layered" or "sandwiched" structure in that not only the upper and lower main surface of the structure is surrounded or encompassed by the further structure, but in addition at least one further side of the structure, e.g. at least one lateral side.

An advantage of embedding the first component carrier within the second component carrier can be seen in providing a higher integration and at the same time an improved mechanical protection of the electronic component within the first component carrier. The first component carrier, which is referred to as "inner component carrier" in the following, is electrically contactable from at least three sides by metallic structures of the second component carrier, which is referred to as "outer component carrier" in the following. Furthermore, the outer component carrier prevents the layers of the inner component carrier from delamination, since the outer component carrier acts like a "sleeve" for the inner component carrier, supporting it from at least three sides. For example, the electronic component within the inner component carrier may produce a large amount of heat during its operation. Thereby, the inner component carrier may experience mechanical stress due to a difference in the coefficients of thermal expansion (CTE) of the different layers. By providing an outer component carrier which "presses" the layers of the inner component carrier together, the delamination of the inner component carrier is reliably prevented even under harsh conditions like temperature variations or mechanical stress.

Furthermore, using the outer component carrier for a mechanical protection of both (a) the inner component carrier and (b) the electronic component enables to design the inner component carrier flatter, since relatively thick protective layers in the inner component carrier can be omitted. For example, an electrically insulating layer of the inner component carrier, which layer is arranged between the electronic component and the outer component carrier, can be designed in a thin manner, since it is not necessary that the respective layer contributes to the mechanical stability. Thereby, a shorter wiring path between the electronic component and further components may be enabled. This may be advantageous, in particular for high speed applications.

A basic idea of the invention can be seen in that the outer component carrier protects the inner component carrier from delamination, wherein a highly integrated multilayer structure with an improved mechanical stability is provided.

In the following, further exemplary embodiments of the electronic device will be explained.

According to an embodiment the first component carrier is embedded within a cavity of the second component carrier such that at least one side wall of the cavity of the second component carrier is in direct contact with a lateral side of the first component carrier.

In particular, the lateral side (which is aligned perpendicular to the main surfaces) of the inner component carrier is covered with the outer component carrier. Further in particular, two, three, four, or all of the lateral sides of the inner component carrier are covered (that is, they are in direct contact) with the outer component carrier. The lateral side(s) as well as the main surfaces of the inner component carrier may be mechanically and electrically connected to the outer component carrier by soldering using solder paste alloy, by wire bonding, or by adhesion using electrically conductive adhesive, for example ACF.

Providing an electronic device, wherein the lateral side(s) of the inner component carrier is (are) in direct contact with the outer component carrier may provide the advantage, that the inner component carrier is easily electrically connectable from at least three sides, in particular from all sides (or all directions).

According to an embodiment, the first component carrier and/or the second component carrier is at least partially made of a flexible material.

In particular, the outer component carrier is made of a flexible material and the inner component carrier may be made of a rigid material. Further in particular, the size (i.e. a lateral extension) of the inner rigid component carrier may be smaller than the size of the outer flexible component carrier. Furthermore, the electronic device may comprise an outer flexible component carrier in which a plurality of inner, rigid component carrier is embedded. This may provide the advantage that the inner component carrier mechanically protects the electronic component, while the outer component carrier is flexibly adaptive to desired shapes and/or flexible during use. In such an embodiment, the electronic device as a whole constitutes a "rigid-flex" multilayer board, wherein the inner, rigid component carrier represents the rigid section which protects the embedded electronic component, and the outer, flexible component carrier represents the flexible section.

According to an embodiment the first component carrier and/or the second component carrier is at least partially made of a rigid or semi-rigid material.

The inner component carrier may be entirely made of a rigid material in order to protect the electronic component embedded therein. In particular, the outer component carrier may be made of a rigid material in the regions where the inner component carrier is embedded within the outer component carrier. This may lead to an improved mechanical protection for the electronic component embedded within the inner component carrier.

According to an embodiment the electronic device further comprises a further component carrier, wherein the first component carrier comprises at least one flexible section, wherein the first component carrier is partially embedded within the second component carrier and partially embedded within the further component carrier, and wherein the flexible section of the first component carrier is arranged between the second component carrier and the further component carrier.

In other words, one end of the inner component carrier is embedded within the outer component carrier and the other opposite end of the inner component carrier is embedded within a further outer component carrier. The electronic component may be arranged on or embedded within a region of the inner component carrier which is embedded within the outer component carrier or the further outer component carrier. In particular, in this embodiment both outer component carriers are rigid. The inner component carrier may comprise at least one flexible section between both outer component carriers. This enables that the outer component carriers are electrically connected to each other by the inner component carrier, wherein the outer component carriers are flexibly movable relatively to each other due to the flexible section of the inner component carrier. Embedding the lateral sides of the inner component carrier within the outer component carriers may protect the inner component carrier from delamination, even when the inner component carrier is bent. Connecting the outer component carrier and the further outer component carrier by the inner flexible component carrier yields an electronic device, wherein the electronic component is mechanically protected while the electronic device can be flexibly adapted to desired shapes.

According to an embodiment, the electronic device further comprises an additional electronic component which is surface mounted on or embedded within the first component carrier.

In particular, both the electronic component and the additional electronic component may be embedded within the inner component carrier. Further in particular, both electronic components may be surface mounted on the inner component carrier. It is also possible to provide an electronic device which has one of the electronic components surface mounted on the inner component carrier and the other of the electronic components embedded within the inner component carrier.

It is to be understood that the number of additional electronic components is not limited to a specific number. There may be two, three or more additional electronic components embedded within the inner component carrier or surface mounted on the inner component carrier.

According to an embodiment, the electronic device further comprises a further additional electronic component which is surface mounted on or embedded within the second component carrier.

The further additional electronic component within or on the outer component carrier can be electrically connected to the electronic component embedded within (or surface mounted on the inner component carrier) by the wiring paths or conductor traces of the inner and/or the outer component carriers. Particularly, the further additional electronic component may be embedded within a portion of the outer component carrier which is made of a rigid material, thereby providing protection against mechanical stress for the further additional electronic component.

It is to be understood that the number of further additional electronic components is not limited to a specific number. There may be two, three or more further additional electronic components embedded within the outer component carrier or surface mounted on the outer component carrier.

According to an embodiment, the first component carrier and the second component carrier are connected to each other by an anisotropic conductive adhesive, in particular by an anisotropic conductive film (ACF).

Particularly, a layer of anisotropic conductive adhesive with a homogenous thickness may be dispensed or printed on a surface of the first component carrier. Then, the first component carrier and the second component carrier may be heat pressed to achieve a reliable mechanical and electrical connection between the first and second component carrier. In particular, the anisotropic conductive adhesive contains a metallic filling material made of electrically conductive material, e.g. beads made of silver, gold or nickel. Connecting the inner component carrier and the outer component carrier by means of anisotropic conductive adhesive may provide a reliable electrical connection between the inner component carrier and the outer component carrier. Particularly, anisotropic conductive adhesive may be advantageous for the connection of flexible structures, since it remains its adhesive and conductive characteristics even when the first component carrier or the second component carrier made of flexible material is/are bent. Further, due to the metallic filling material, anisotropic conductive adhesive may contribute to the heat dissipation from the electronic device to the environment.

In the context of the present application, the term "anisotropic conductive adhesive" denotes an adhesive which, due to the distribution of the metallic filling particles, has electrically conductive properties selectively in one direction, particularly in z-direction (or thickness direction) which is perpendicular to the main surfaces of the component carrier. The use of anisotropic conductive film may be further advantageous, since it can e.g. be printed on e.g. a whole surface area of the component carrier such that the anisotropic conductive film covers multiple adjacent electrically conductive structures, e.g. wiring paths, of the component carrier. Due to the anisotropic characteristic of ACF, it selectively connects the electrically conductive structures of the component carriers in z-direction and prevents short-circuits between the wiring paths in x- or y-directions.

According to an embodiment the electronic device further comprises a third component carrier, wherein the second component carrier is embedded within the third component carrier. In other words, the first, inner component carrier is embedded within the second component carrier which itself is embedded within a third outermost component carrier.

The third component carrier may be made of a flexible material. The second component carrier may comprise rigid sections in the regions, where the first component carrier is embedded within the second component carrier, and may comprise flexible sections in other regions. In such an embodiment, the rigid sections of the second component carrier may provide mechanical protection for the first inner component carrier, while the other sections are flexibly bendable together with the third outermost component carrier. This enables an electronic device with a sufficient flexibility and a high integration, wherein the third outermost component carrier protects the inner component carriers from delamination.

It is to be understood by those skilled in the art that the number of component carriers is not limited to a specific number. The third component carrier may be embedded within a fourth component carrier, which itself may be embedded within a sixth component carrier and so on.

According to an embodiment the first component carrier and/or the second component carrier comprises or consists of a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further electronic components and being nevertheless very thin and compact. The term "layer structure" may particularly denote a continuous layer, a patterned layer or a plurality of non-consecutive islands within a common plane.

In an embodiment, the at least one electrically insulating layer structure comprises at least one of the group consisting of resin (such as reinforced or non-reinforced resins, for instance epoxy resin or Bismaleimide-Triazine resin, more specifically FR-4 or FR-5), cyanate ester, polyphenylene derivate, glass (in particular glass fibers, multi-layer glass, glass-like materials), prepreg material, polyimide, polyamide, liquid crystal polymer (LCP), epoxy-based Build-Up Film, polytetrafluoroethylene (Teflon), a ceramic, and a metal oxide. Reinforcing materials such as webs, fibers or spheres, for example made of glass (multilayer glass) may be used as well. Although prepreg or FR4 are usually preferred, other materials may be used as well. For high frequency applications, high-frequency materials such as polytetrafluoroethylene, liquid crystal polymer and/or cyanate ester resins may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

According to an embodiment the electronic component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite core) or may be a paramagnetic element. However, the component may also be a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

According to an embodiment, the method of manufacturing the electronic device further comprises at least partially embedding the second component carrier within a third component carrier.

In particular, the second component carrier may be connected to the second component carrier by soldering using solder paste alloy, by wire bonding, or by adhesion using electrically conductive adhesive, for example anisotropic conductive film (ACF).

The aspects defined above and further aspects of the invention are apparent from the examples of embodiment to be described hereinafter and are explained with reference to these examples of embodiment.

Figure 1:
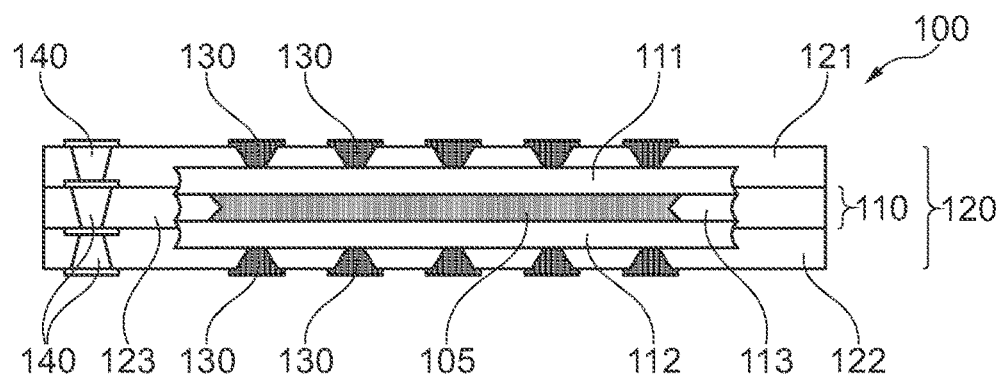
FIG. 1 shows a cross-sectional view of an electronic device according to an exemplary embodiment of the invention.

DETAILED DESCRIPTION OF EXEMPLARY
EMBODIMENTS

The illustrations in the drawings are presented schematically. In different drawings, similar or identical elements are provided with the same reference signs.

FIG. 1 shows a cross-sectional view of an electronic device 100 according to an exemplary embodiment of the invention. The electronic device 100 comprises an electronic component 105 which is embedded within a first component carrier 110. The first component carrier 110 comprises electrically insulating layers 111, 112, 123 between which the electronic component 105 is accommodated. The dimensions of said layers of the first component carrier can be selected such that the electrically insulating layer 111 is in flush with the electronic component 105, in particular an upper surface of the electronic component, and is in flush with the core layer 113. Likewise, the electrically insulating layer 112 may be in flush with the electronic component, in particular a lower surface of the electronic component, and is in flush with the core layer 113. The electrical connection of the electronic component 105 can be realized by one or more vias 114. Said vias may be formed by laser and may be filled and/or plated with electrically conductive material, such as copper and/or conductive paste. The first component carrier 110 further comprises an electrically insulating core layer 113. It is to be understood that the first component carrier may additionally comprise electrically conductive or further electrically insulating layers.

The electronic device 100 further comprises a second component carrier 120. As can be seen from FIG. 1, the first component carrier 110 is embedded within the second component carrier 120. In the shown example, the first (or inner) component carrier is embedded within the second (or outer) component carrier such that all lateral sides of the inner component carrier 110 are surrounded, in particular covered with the second component carrier. The dimensions of the layers 121, 122, 123 may be selected such that the electrically insulating layer 121 is in flush with the inner component carrier, in particular an upper surface of the inner component carrier, and is in flush with the core layer 123. Likewise, the electrically insulating layer 122 may be in flush with the electronic component, in particular a lower surface of the electronic component, and is in flush with the core layer 123. The electrical and mechanical connection between the inner component carrier 110 and outer component carrier 120 may be provided by anisotropic conductive film (not shown). The outer component carrier 120 comprises a core layer 123 which may be made of ceramic, metal, FR4 or any desired substrate material. The outer component carrier 120 further comprises two outer electrically insulating layers 121, 122. The electrical connection from the outside to the electronic component 105 may be provided by vias 130 in the electrically insulating layers 121, 122 of the outer component carrier 120. The vias 130 may be filled or plated with electrically conductive material, e.g. conductive paste and/or copper. As electrically insulating layers 121, 122, so-called pre-structured (or pre-cut) prepreg layers may be used, wherein a recess or cavity is pre-cut within the prepreg layer for accommodation of the inner component carrier 110.

The outer component carrier comprises further vias 140 for providing an electrical connection from the upper main surface to the lower main surface or to any further layers of the second component carrier 120. Also the further vias 140 may be filled or plated with electrically conductive material. The first component carrier 110 and the second component carrier 120 may be rigid component carriers, flexible component carriers or rigid-flex component carriers. Providing a rigid inner component carrier 110 and a flexible outer component carrier 120 may provide the advantage that the inner component carrier 110 provides mechanical stability, while the outer component carrier 120 is adaptable to desired shapes or bendable during use.

Figure 2:
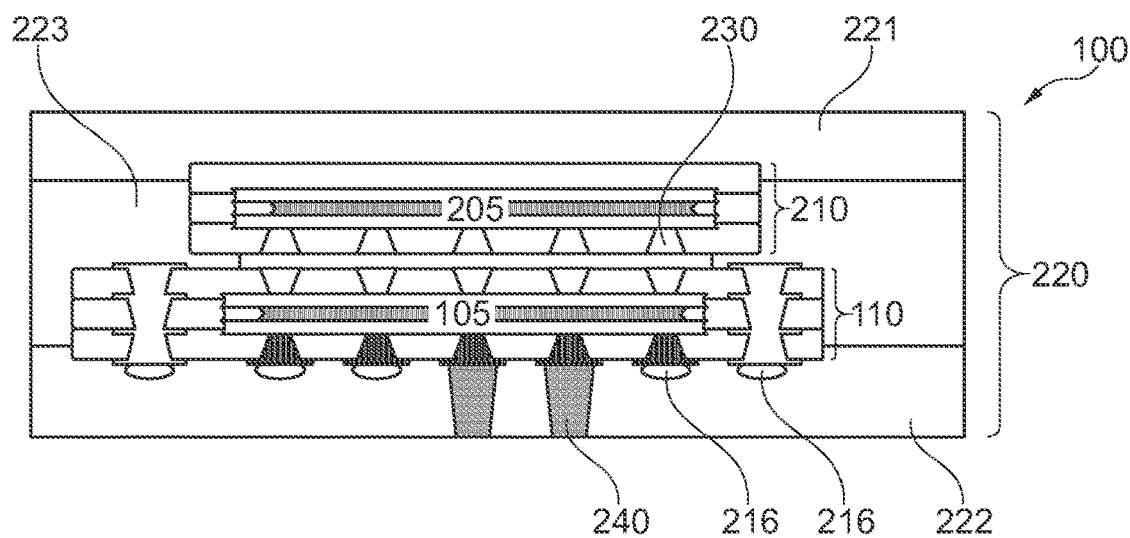
FIG. 2 shows a cross sectional view of an electronic device according to another exemplary embodiment of the invention.

FIG. 2 shows a cross sectional view of an electronic device 100 according to another exemplary embodiment. The electronic device 100 differs from that of FIG. 1 in that the electronic device 100 comprises two inner component carriers 110, 210 which are both embedded within an outer component carrier 220. Each of the inner component carriers 110, 210 may have a structure which is the same of the inner component carrier 110 shown in FIG. 1. Correspondingly, in each of the inner component carriers 110, 210, one or more electronic components 105, 205 are embedded or mounted thereon. The embedded component carriers 110, 210 are attached to each other by ACF. It is to be understood that also other connection means like solder paste alloy, connectors, special jigs etc. may be employed. For providing an electrical connection between the electronic components 105, 205, additional conductive vias 230 in layers of the inner component carriers 110, 210 can be provided. The inner component carriers 110, 210 can be electrically connected to each other by means of a conductive adhesive layer 201. Alternatively, the inner component carriers 110, 210 can be electrically connected to each other by soldering, bonding, welding or any other connection structure. The outer component carrier 220 in the shown example has a core layer 223 and electrically insulating layers 221, 222 which comprise vias 240 for an electrical connection to the outside. At least one of the embedded component carriers may comprise solder bumps 216 for electrical connection of the electronic component to conductive structures of the outer component carrier 220. It is to be understood by those skilled in the art that, although the inner and outer component carriers 110, 120, 210, 220, 320 shown in FIGS. 1 and 2 each have a number of three layers, it is also possible to use component carriers with any other arbitrary number and sequence of layers without extending beyond the scope of the invention.

Figure 3:
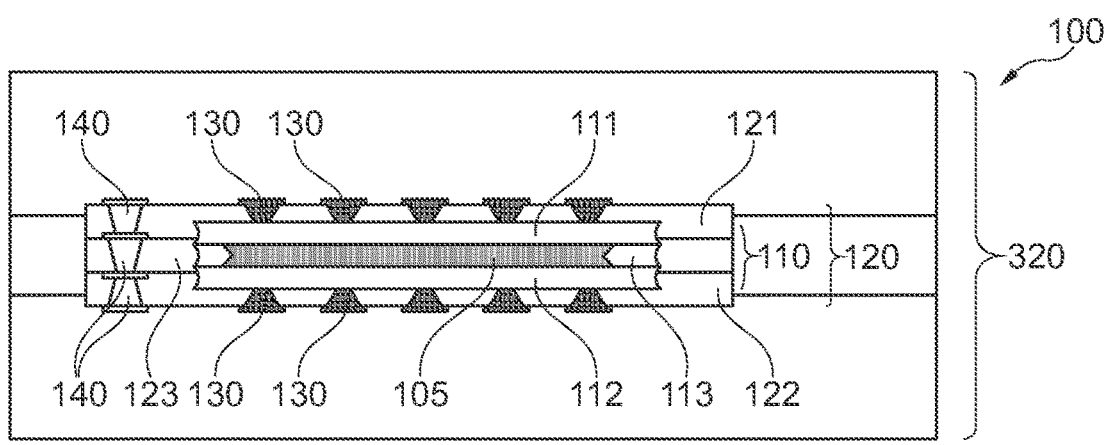
FIG. 3 shows a cross sectional view of an electronic device according to yet another exemplary embodiment of the invention.

FIG. 3 shows a cross sectional view of an electronic device 100 according to another exemplary embodiment of the invention. In particular, FIG. 3 shows a multilayer structure having a higher level of integration. That is, the electronic device 100 comprises the electronic device from FIG. 1 which is embedded within a third (outermost) component carrier 320. The connection means (not shown) of the third component carrier 320 may be the same as in the electronic devices of FIGS. 1 and 2 (conductive vias, solder bumps etc.). As can be best understood from FIG. 3, by embedding the component carriers within each other, the wiring paths between the component carriers 110, 120, 320 can be kept short in comparison to a conventional vertically stacked electronic device. For example, a wiring path from the first component carrier 110 to the third component carrier 320 only has to pass through a part of the second component carrier 120, whereas in a conventional vertically stacked arrangement, the wiring path from an uppermost component carrier to a lowermost component carrier has to pass through an entire central component carrier. Of course, it is possible to integrate the shown embodiment within another component carrier to achieve an even higher level of integration, as mentioned above.

Figure 4:
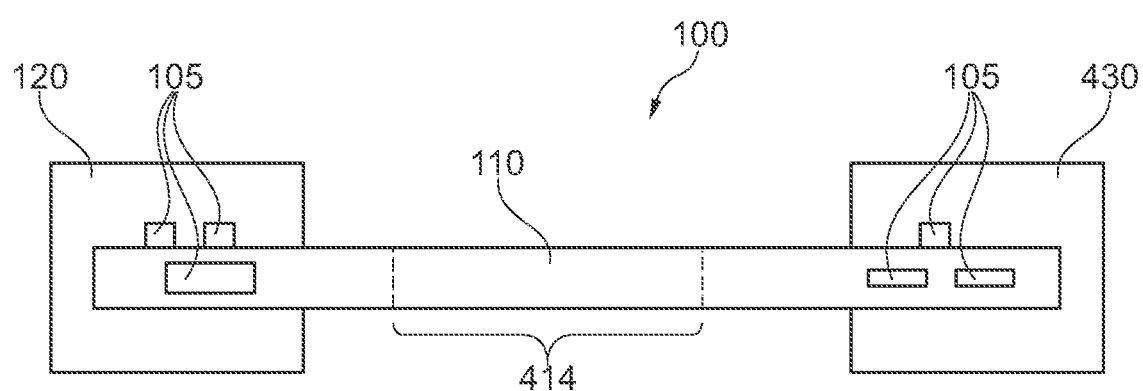
FIG. 4 shows a cross sectional view of an electronic device according to yet another exemplary embodiment of the invention.

FIG. 4 shows a cross sectional view of an electronic device 100 according to another exemplary embodiment of the invention. The electronic device 100 may be entirely made of flexible material or comprises at least one flexible section 414. One end of the first component carrier is embedded within the second component carrier 120 and the opposite end of the first component carrier is embedded within a further component carrier 430 (which are referred to as "outer component carriers" in the following). The outer component carriers 120, 430 are made of rigid material in the shown example. In the regions of the first component carrier 110 which are embedded within the outer component carriers 120, 430, a plurality of electronic components 105 are mounted on the first component carrier 110 and embedded within the first component carrier 110. The rigid, outer component carriers may provide mechanical protection, while the flexible section 414 which is arranged between the outer component carriers 120, 430 enables the outer component carriers 120, 430 to be flexibly movable with respect to one another.

It should be noted that the term "comprising" does not exclude other elements or steps and the term "a" or "an" does not exclude a plurality. Also elements described in association with different embodiments may be combined.

Implementation of the embodiments of the invention is not limited to the preferred embodiments shown in the figures and described above. Instead, a multiplicity of variants are possible which use the solutions shown and the principle according to embodiments of the invention even in the case of fundamentally different embodiments.

LIST OF REFERENCE SIGNS 100 electronic device
105 electronic component
110 first component carrier
111 electrically insulating layer
112 electrically insulating layer
113 electrically insulating core layer
114 via
120 second component carrier
121 electrically insulating layer
122 electrically insulating layer
123 core layer
130 vias
140 vias
201 conductive adhesive layer
205 electronic component
210 inner component carrier
216 solder bumps
220 outer component carrier
221 electrically insulating layer
222 electrically insulating layer
223 core layer
230 via
240 via
320 third component carrier
414 flexible section
430 third component carrier

The invention claimed is:
1. An electronic device, comprising:
a first component carrier;
an electronic component which is surface mounted on or embedded within the first component carrier;
a second component carrier;
wherein the first component carrier together with the electronic component is at least partially embedded within the second component carrier;
wherein the electronic component is selected from a group consisting of a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element and a logic chip;

wherein the first component carrier comprises rigid sections in regions where the first component carrier is embedded within the second component carrier and comprises flexible sections in other regions;

wherein the first component carrier is embedded within a cavity of the second component carrier, such that at least one side wall of the cavity of the second component carrier is in direct contact with a lateral side of the first component carrier.

2. The electronic device according to claim 1,
wherein the second component carrier is at least partially made of a flexible material.

3. The electronic device according to claim 1,
wherein the first component carrier and/or the second component carrier is at least partially made of a rigid or semi-rigid material.

4. The electronic device according to claim 1, further comprising:
an additional electronic component which is surface mounted on or embedded within the first component carrier.

5. The electronic device according to claim 1, further comprising:
a further additional electronic component which is surface mounted on or embedded within the second component carrier.

6. The electronic device according to claim 1,
wherein the first component carrier and the second component carrier are connected to each other by an anisotropic conductive adhesive film.

7. The electronic device according to claim 1, further comprising:
a third component carrier;
wherein an opposed lateral side of the first component carrier is partially embedded within the third component carrier.

8. The electronic device according to claim 1, wherein the first component carrier and/or the second component carrier comprises a stack of at least one electrically insulating layer structure and at least one electrically conductive layer structure.

9. The electronic device according to claim 8, wherein the at least one electrically insulating layer structure comprises at least one of the group consisting of reinforced or non-reinforced resin, epoxy resin, Bismaleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide.

10. The electronic device according to claim 8, wherein the at least one electrically conductive layer structure comprises at least one of the group consisting of copper, aluminum, nickel, silver, gold, palladium, and tungsten.

11. A method of manufacturing an electronic device, the method comprising:
embedding an electronic component within a first component carrier or surface mounting the electronic component on the first component carrier; and
at least partially embedding the first component carrier with the electronic component within a second component carrier;
wherein the electronic component is selected from a group consisting of a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element and a logic chip;
wherein the first component carrier comprises rigid sections in regions where the first component carrier is embedded within the second component carrier and comprises flexible sections in other regions;
wherein the first component carrier is embedded within a cavity of the second component carrier, such that at least one side wall of the cavity of the second component carrier is in direct contact with a lateral side of the first component carrier.

12. The method according to claim 11, further comprising:
partially embedding an opposed lateral side of the first component carrier within a third component carrier.

\* \* \* \* \*